(12) United States Patent
George

(10) Patent No.: US 7,061,274 B2
(45) Date of Patent: Jun. 13, 2006

(54) SELF-PROGRAMMABLE BIDIRECTIONAL BUFFER CIRCUIT AND METHOD

(75) Inventor: Varghese George, Contra Costa, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 11 days.

(21) Appl. No.: 10/671,416

(22) Filed: Sep. 24, 2003

(65) Prior Publication Data

US 2005/0062500 A1    Mar. 24, 2005

(51) Int. Cl.
*H03K 19/094*    (2006.01)
(52) U.S. Cl. .......................................... 326/86; 326/62
(58) Field of Classification Search .................. 326/86, 326/82, 90, 56, 62; 327/108; 710/31
See application file for complete search history.

(56) References Cited

U.S. PATENT DOCUMENTS 5,214,330 A * 5/1993 Okazaki ...................... 326/90
5,923,187 A * 7/1999 Maugars ...................... 326/86
6,834,318 B1 * 12/2004 Hunter et al. ............... 710/110

* cited by examiner

*Primary Examiner*—James H. Cho
(74) *Attorney, Agent, or Firm*—Lisa K. Jorgenson; Bryan A. Santarelli

(57) ABSTRACT

The present invention is directed to programmable bidirectional buffers and methods for programming such buffers. One method of according to an aspect of the present invention is a method of configuring a bidirectional buffer including first and second signal nodes. The method includes applying a configuration signal on one of the first and second signal nodes and configuring the buffer responsive to the applied configuration signal.

23 Claims, 7 Drawing Sheets

SELF-PROGRAMMABLE BIDIRECTIONAL BUFFER CIRCUIT AND METHOD

TECHNICAL FIELD

The present invention relates generally to integrated circuits, and more specifically to configuring or programming components contained in an integrated circuit.

BACKGROUND

In digital electronic circuits, buffers are circuits that receive a digital input signal on an input and develop a digital output signal on an output in response to the input signal. The function of a buffer is typically to isolate logic circuitry supplying the digital input signal to the input of the buffer from a capacitive load coupled to the output of the buffer. The logic circuitry is not typically designed to drive a large capacitive load and thus, if coupled directly to such a load, a long delay may result in driving a voltage across the load to a desired level.

A bidirectional buffer is a buffer circuit that may be programmed or configured to operate either in a first direction or a second direction. Typically, a bidirectional buffer is formed by a pair of cross-coupled buffers that operate in the first direction to drive a signal on a first node in response to a signal on a second node. Conversely, the cross-coupled buffers operate in the second direction to drive a signal on the second node in response to a signal on the first node. Such a bidirectional buffer has memory elements that are utilized to control the direction of operation of the buffer. Each bidirectional buffer includes two memory elements, each memory element being associated with a respective one of the cross-coupled buffers. Each memory element stores data to either enable or disable the corresponding buffer and thereby set the direction of operation of the bidirectional buffer. For example, when each memory element stores a first logic state the corresponding buffer is activated, and when the memory element stores a second logic state the buffer is placed in a high impedance state or disabled. In operation, data having complementary logic states is stored in the memory elements to activate the buffers in the desired direction, or, alternatively, the second logic state is stored in both memory elements to disable both buffers. Note the first logic state is not typically be stored in both memory elements since in this case both buffers would be activated, as will be appreciated by those skilled in the art.

Bidirectional buffers are commonly utilized in programmable integrated circuits, such as field programmable gate arrays (FPGAs), to interconnect functional components within the circuit as required. FIG. 1 is functional block diagram illustrating a portion of a conventional programmable integrated circuit 100 including a number of bidirectional buffers 102a–e, with each buffer including an associated pair of memory cells MC that store data to program the direction of operation of the buffer. A first programmable switch 104 is coupled in series with the buffers 102a, 102b between a first node A and a second node B, where nodes A and B represent either input or output connections to other functional circuitry (not shown) in the integrated circuit 100. A programming logic circuit 106 applies configuration signals 108 to the programmable switch 104 which, in response to these signals, couples selected pairs of the buffers 102a, 102b, and 102e together. In the example of FIG. 1, the switch 104 couples buffer 102a to buffer 102e as indicated by the solid line in the switch.

A second programmable switch 110 is coupled in series with the buffers 102c, 102d between nodes C and D and operates in the same way as the switch 104 to couple selected pairs of the buffers 102c, 102d, 102e together responsive to the signals 108. The switch 110 couples the buffer 102e to the buffer 102d in the example of FIG. 1. Thus, in FIG. 1 node A is coupled to node D through buffer 102a, switch 104, buffer 102e, switch 110, and buffer 102d, with either node A being the input or output depending on the direction of operation of these buffers as determined by the data stored in the corresponding memory cells MC.

In operation, the programming logic 106 receives input signals 112 which would typically include the configuration data for each buffer 102 in form of data to be stored in the associated memory cells MC of the buffer. In response to the input signals 112, the programming logic 106 develops the configuration signals 108 to transfer the configuration data into all the memory cells MC to thereby configure the buffers 102. The programming logic 106 also develops the configuration signals 108 to program the switches 104 using corresponding configuration data.

The programming logic 106 typically transfers the configuration data into the memory cells MC of each buffer 102 in one of two ways. In a first approach, the memory cells MC are serially connected (not shown) and the programming logic 106 applies reset, clocking, and data signals to sequentially shift configuration data into a first pair of memory cells MC and then from pair to pair of memory cells until each pair of memory cells stores the required configuration data. In a second approach, the programming logic 106 includes addressing circuitry (not shown) and the input signals 112 include configuration data and address information for each pair of memory cells MC. With this approach, the programming logic 106 applies reset, address, data, and control signals to the memory cells MC to store the desired configuration data in each pair of memory cells.

In both of these conventional approaches to loading configuration data into the memory cells MC, a significant amount of circuitry may needed to form the programming logic 106, thus consuming valuable space in the integrated circuit 100 that could otherwise be utilized for other functionality. Moreover, each of these approaches requires a significant number of physical lines be routed to provide the signals 108 to each of the memory cells MC and transfer the configuration data into the memory cells. For example, as previously mentioned with the first approach where the memory cells MC are serially connected, the signals 108 must include reset, clocking, and data signals routed to the memory cells. The second approach requires even more physical lines for the signals 108 be routed to the memory cells MC to perform the required reset, addressing, and data transfer to the cells, and the programming logic 106 would typically be more complicated and thus require more circuitry in this approach.

There is a need for configuring bidirectional buffers in an integrated circuit in a way that simplifies programming logic on the chip required to perform such configuration and simplifies the routing of configuration lines to each buffer that are required for configuration.

SUMMARY

According to one aspect of the present invention, a method of configuring a bidirectional buffer is disclosed. The buffer includes first and second signal nodes, and the method includes applying a configuration signal on one of the first and second signal nodes and configuring the buffer responsive to the applied configuration signal.

DETAILED DESCRIPTION

Figure 1:
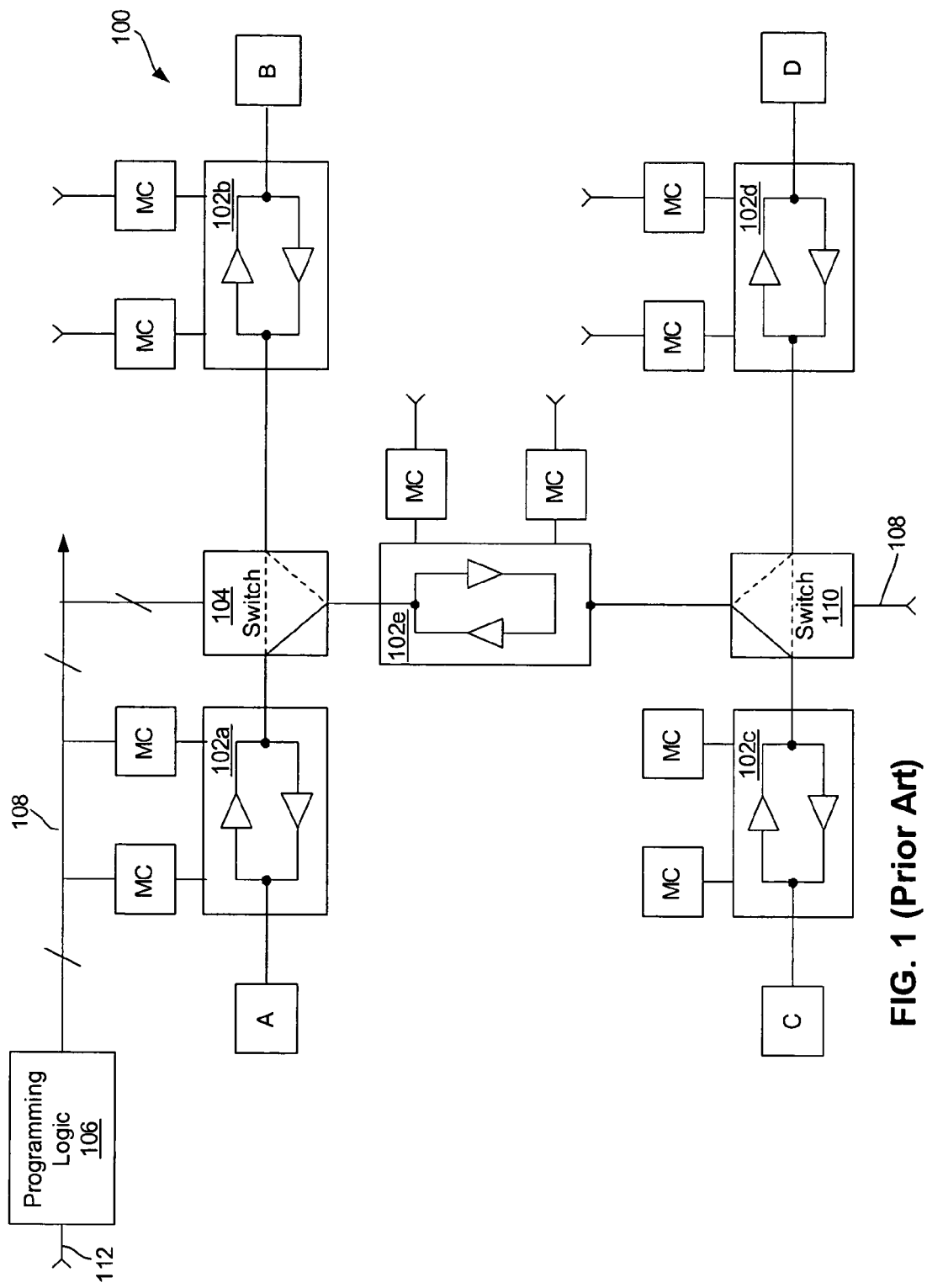
FIG. 1 is a functional block diagram of a portion of a conventional programmable integrated circuit including a plurality of bidirectional buffers that are individually programmed.
Figure 2:
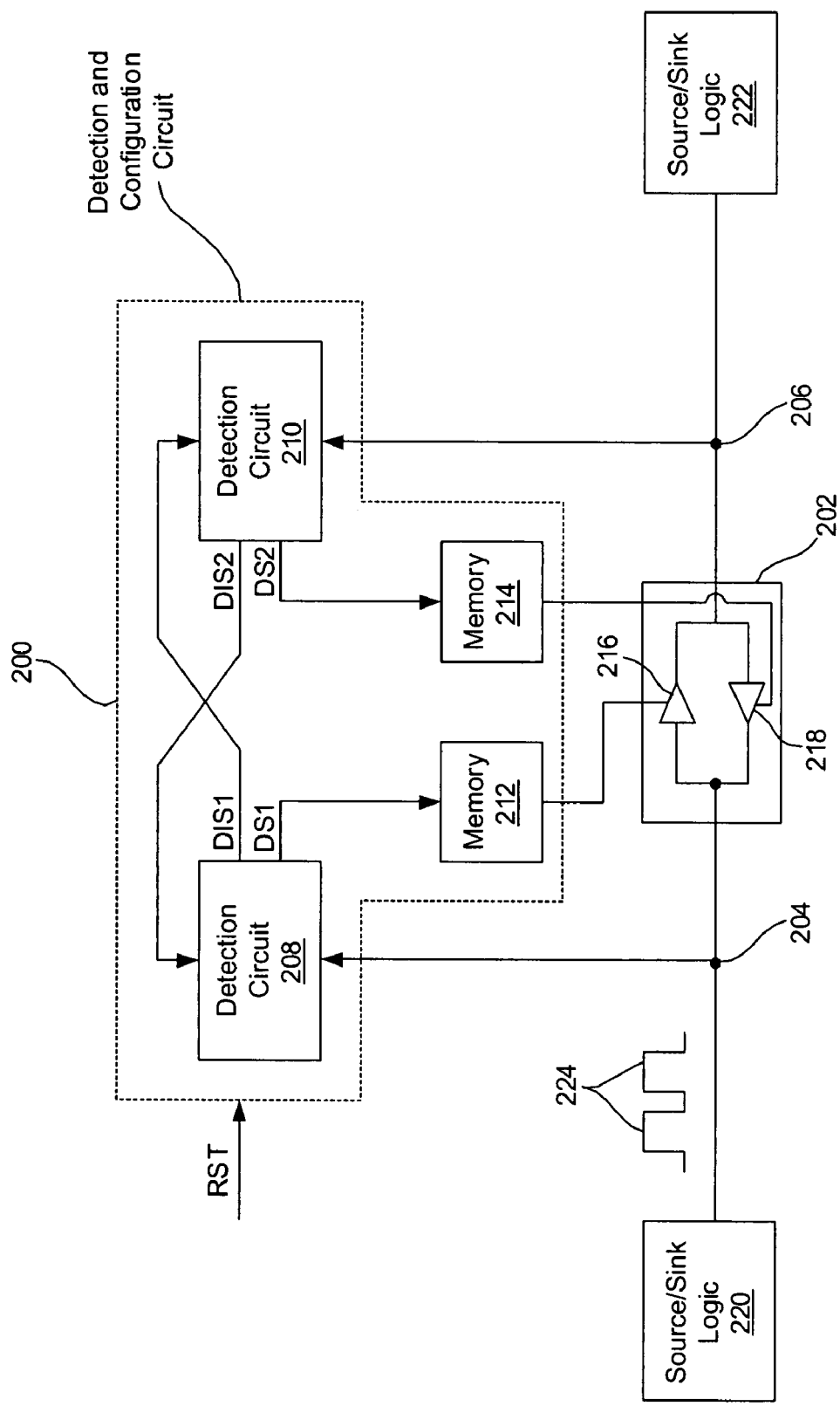
FIG. 2 is a functional block diagram of a detection and configuration circuit for configuring a bidirectional buffer according to one embodiment of the present invention.

FIG. 2 is a functional block diagram of a detection and configuration circuit 200 for configuring a bidirectional buffer 202 in response to a signal applied on either a first node 204 or a second node 206 according to one embodiment of the present invention. One of the first node 204 or second node 206 functions as the input of the buffer 202 and the other node as the output of the buffer, with the function of each node depending on direction in which the buffer is configured to operate. In this way, the detection and configuration circuit 200 configures the bidirectional buffer 202 responsive to signals applied on the input and output nodes 204, 206 of the buffer and thus eliminates the need to route configuration lines to each buffer as with conventional bidirectional buffer circuits, as will be explained in more detail below.

In the following description, certain details are set forth to provide a sufficient understanding of the present invention, but one skilled in the art will appreciate that the invention may be practiced without these particular details. Furthermore, one skilled in the art will appreciate that the example embodiments described below do not limit the scope of the present invention, and will also understand various modifications, equivalents, and combinations of the disclosed example embodiments and components of such embodiments are within the scope of the present invention. Illustrations of the various embodiments, when presented by way of illustrative examples, are intended only to further illustrate certain details of the various embodiments, and should not be interpreted as limiting the scope of the present invention. Finally, in other instances below, the operation of well known components has not been shown or described in detail to avoid unnecessarily obscuring the present invention.

The detection and configuration circuit 200 includes a first detection circuit 208 that detects whether a configuration signal is applied on the node 204 and a second detection circuit 210 that detects whether a configuration signal is applied on the node 206. When the first detection circuit 208 detects the configuration signal on node 204, the detection circuit activates a first disable signal DIS1 that is applied to the second detection circuit 210 and also activates a first direction signal DS1 that is applied to a first memory element 212. The second detection circuit 210 operates in the same way in response to a configuration signal on the node 206, namely applying an active second disable signal DIS2 to the first detection circuit 208 and activating a second direction signal DS2 that is applied to a second memory element 214. In response to the active DS1 signal, the memory element 212 stores data having a logic state that enables a first cross-coupled buffer circuit 216 in the bidirectional buffer 202, and in response to the active DS2 signal the memory element 214 stores data having a logic state that enables a second cross-coupled buffer circuit 218 in the bidirectional buffer. When either of the detection circuits 208, 210 receives the active DIS signal from the other detection circuit, the detection circuit receiving the DIS signal is disabled to prevent the circuit from generating the corresponding DS1, DS2 signal. For example, in response to the DIS1 signal from the first detection circuit 208, the second detection circuit 210 is disabled and thus will not activate the corresponding DIS2 and DS2 signals regardless of the presence of the configuration signal on the node 206.

The node 204 is coupled to source/sink logic 220 corresponding to other circuitry contained in the integrated circuit in which the bidirectional buffer 202 and detection and configuration circuit 200 are formed. The same is true of source/sink logic 222 coupled to the node 206. For example, the source/sink logic 220, 222 could correspond to additional bidirectional buffers 202 and associated detection and configuration circuits 200, or could correspond to combinational logic that is being configured to perform a desired function, or could be an external terminal of the integrated circuit containing the buffer 202. A reset signal RST is applied by external circuitry (not shown) to the detection and configuration circuit 200, and in response to the reset signal the first and second detection circuits 208, 210 deactivate the corresponding DIS1, DIS2, DS1, DS2 signals, and the memory elements 212, 214 store logic states to disable the corresponding buffer circuits 216, 218.

In operation, the external circuitry initially activates the reset signal RST to reset the detection circuits 208, 210 to thereby deactivate the DIS1, DIS2, DS1, DS2 signals and to cause the memory elements 212, 214 to disable the corresponding buffer circuits 216, 218. At this point, the logic 220, 222 applies the configuration signal on either the node 204 or 206 depending upon the desired direction of operation of the bidirectional buffer 202. For example, when the bidirectional buffer 202 is to operate in a first direction such that the node 204 corresponds to an input node and the node 206 corresponds to an output node of the buffer, the configuration signal is applied on node 204. In response to the configuration signal, the detection circuit 208 activates the DIS1 signal to thereby deactivate the detection circuit 210. Once deactivated, the detection circuit 210 maintains the DIS2, DS2 signals inactive regardless of the signals present on the node 206. The detection circuit 208 also activates the DS1 signal in response to the configuration signal on node 204, and in response to the active DS1 signal the memory element 212 stores a logic state that activates the buffer circuit 216. Note that at this point the memory element 214 stores a logic state that disables the buffer circuit 218, and thus the bidirectional buffer 202 has been programmed to operate in a first direction with the buffer circuit 216 providing an output signal on the node 206 in response to an input signal applied on the node 204.

When the configuration signal is applied on node 206, the bidirectional buffer 202 and the detection and configuration circuit 200 operate in the same way as just described to configure the bidirectional buffer for operation in a second direction such that the node 206 corresponds to an input node and the node 204 corresponds to an output node. In response to the configuration signal on node 206, the detection circuit 210 activates the DIS2 signal to thereby deactivate the detection circuit 208 and also activates the DS2 signal. In response to the active DS2 signal the memory element 214 stores a logic state that activates the buffer circuit 218. At this point the memory element 212 stores a logic state that disables the buffer circuit 216, and thus the bidirectional buffer 202 has been programmed to operate in a second direction with the buffer circuit 218 providing an output signal on the node 204 in response to an input signal applied on the node 206.

With the detection and configuration circuit 200, the bidirectional buffer 202 may be programmed to operate in the desired direction without routing separate configuration lines to the memory elements 212, 214 associated with the buffer. Instead, the configuration signal is merely applied on one of the nodes 204, 206 that functions as the input and output nodes of the bidirectional buffer 202. The elimination of the separate configuration lines saves space in the integrated circuit containing the bidirectional buffers 202, allowing for the formation of additional functional circuitry in the integrated circuit such as additional bidirectional buffers are additional logic circuitry. Furthermore, elimination of the configuration lines simplifies the interconnection of components in the integrated circuit and thereby lowers the cost and improves the reliability of the integrated circuit, as will be appreciated by those skilled in the art.

The configuration signal applied on either node 204 or 206 may take a variety of different forms with the detection circuits 208, 210 being designed to detect the type of configuration signal being utilized. For example, as shown in FIG. 2 the configuration signal may correspond to a series of pulses 224 as shown on node 204. Conversely, the configuration signal may correspond to a signal having a particular voltage level which is then detected by the detection circuits 208, 210. Still another example is a configuration signal having a specific frequency which, once again, maybe detected by the detection circuits 208, 210. The configuration signal may take these and other forms as will be appreciated by those skilled in the art.

Figure 3:
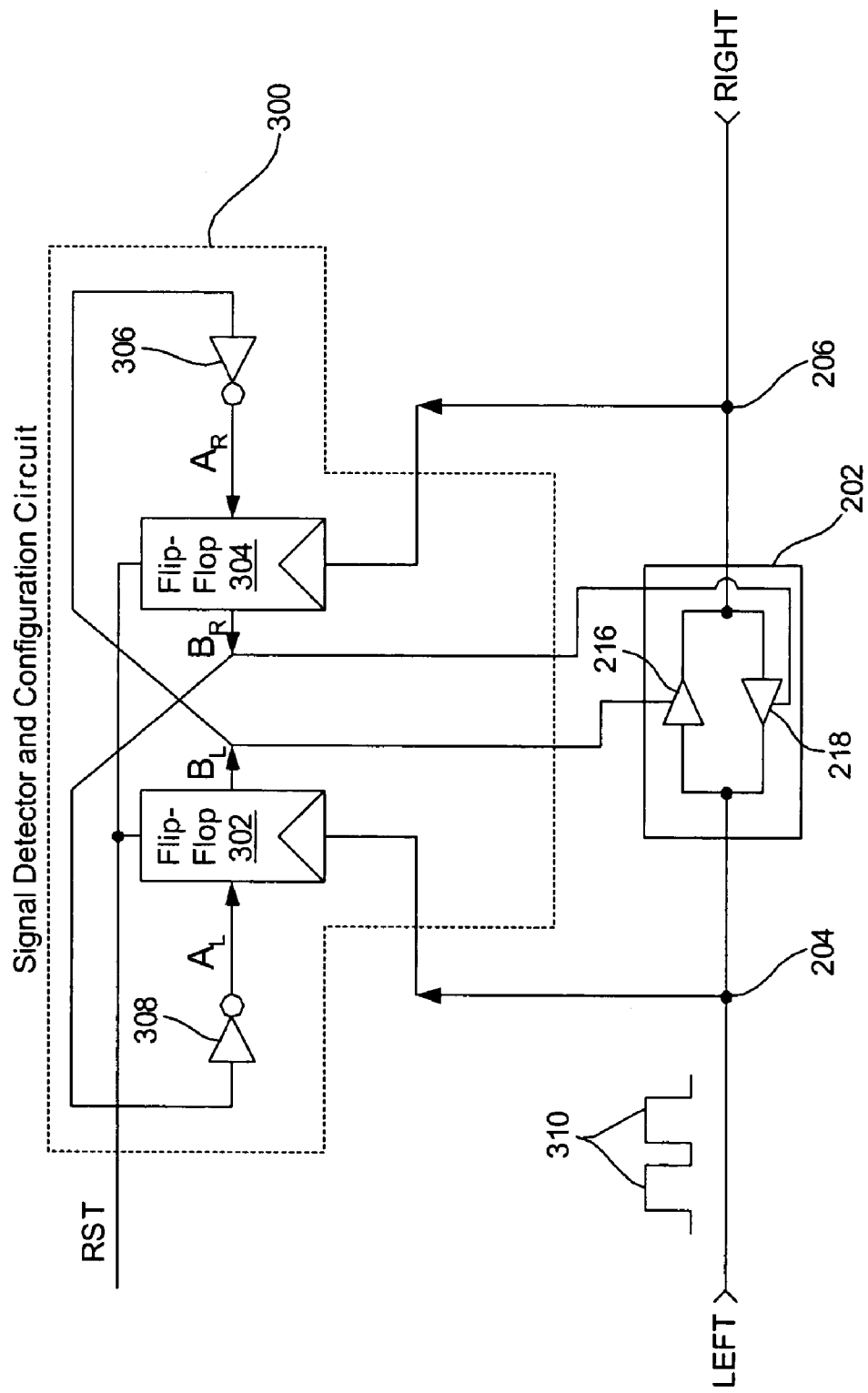
FIG. 3 is a functional block diagram of illustrating in more detail an edge-triggered embodiment of the detection and configuration circuit of FIG. 2.

FIG. 3 is a functional block diagram illustrating an edge-triggered detection and configuration circuit 300 according to one embodiment of the detection and configuration circuit 200 of FIG. 2. In FIG. 3, components that are the same as previously described with reference to FIG. 2 has been given the same reference numerals and will BL again be described in detail. The edge-triggered detection and configuration circuit 300 includes a first flip-flop 302 that is clocked in response to the configuration signal being applied on the node 204 and a second flip-flop 304 that is clocked in response to the configuration signal being applied on the node 206. An output signal of the flip-flop 302 is designated BL and is applied through an inverter 306 to generate an input signal AR that is applied to an input of the flip-flop 304. Similarly, an output signal of the flip-flop 304 is designated BR and is applied through an inverter 308 to generate an input signal AL that is applied to an input of the flip-flop 302. The reset signal RST is applied to reset inputs of the flip-flops 302, 304, and in response to the reset signal each flip-flop latches its output inactive low. The flip-flops 302, 304 and inverters 306, 308 operate in combination to perform the functions of the detection circuits 208, 210 and a memory elements 212, 214 of FIG. 2, as will be explained in more detail below.

In operation, the reset signal RST is initially activated to reset the flip-flops 302, 304. In response to the RST signal, the flip-flops 302 and 304 latch the output signals BL and BR inactive low, respectively. At this point, the low BL signal from the flip-flop 302 is applied through the inverter 306 to provide a high AR signal to the input of the flip-flop 304. Similarly, the low BR signal from the flip-flop 304 is applied through the inverter 308 to provide a high AL signal to the input of the flip-flop 302. Once the flip-flops 302, 304 have been reset, the configuration signal is applied on one of the nodes 204, 206 to configure the bidirectional buffer 202 in the desired direction. For example, if the bidirectional buffer 202 is to be configured to operate in a first direction such that the input node corresponds to node 204 and the output node corresponds to node 206 then the configuration signal is applied on the node 204. In the embodiment of FIG. 3, the configuration signal takes the form of a pulse or a series of pulses applied on the appropriate node 204, 206, as indicated by pulses 310.

In response to the first rising edge of the configuration signal 310, the flip-flop 302 latches the high AL signal on its input and drives the BL signal high in response to the latched AL signal. The high BL signal activates the buffer circuit 216 in the bidirectional buffer 202, and is also applied through the inverter 306 to drive the AR signal applied to the input of the flip-flop 304 low. At this point, when the rising edge of the configuration signal 310 or a next rising edge of the configuration signal propagates through the buffer circuit 216, the corresponding rising edge generated on the node 206 clocks the flip-flop 304. In response to the rising edge on node 206, the flip-flop 304 latches the low AR signal on its input and thus continues providing the low BR signal in response to the latched AR signal.

At this point, even if clocked by the rising edges of subsequent configuration signals 310, the flip-flops 302, 304 do not change state and in this way configure the bidirectional buffer to operate in the desired direction. This is true because each time the AL signal input to flip-flop 302 remains high in response to the low signal BR output from flip-flop 304 and the AR signal input to flip-flop 304 remains low in response to the high signal BL output from flip-flop 302. In this way, the first flip-flop 302, 304 to be clocked enables the corresponding buffer circuit 216, 218 and disables the other flip-flop from enabling the other buffer circuit. Thus, when the configuration signal 310 is applied on node 204 the flip-flop 302 enables buffer circuit 216 and disables flip-flop 304 from enabling buffer circuit 218, and, conversely, when the configuration signal is applied on node 206 the flip-flop 304 enables buffer circuit 218 and disables flip-flop 302 from enabling buffer circuit 216. Once the desired buffer circuit 216 or 218 has been enabled, the enabled buffer circuit provides a signal on its output responsive to a signal on it input and thereby defines the direction of operation of the bidirectional buffer.

In the edge-triggered embodiment of FIG. 3, the flip-flop 302, 304 that is being disabled must not be clocked before the low input signal AL or AR has been applied to the input of that flip-flop, as will be appreciated by those skilled in the art. For example, if the configuration signal 310 is applied on node 204 then the BL signal output from flip-flop 302 must go high and then propagate through the inverter 306 to drive the AR signal low before the flip-flop 304 is clocked. If the AR signal is not low before the flip-flop 304 is clocked, then the BR signal will be latched high and enable the buffer circuit 218. In this situation, both buffer circuits 216, 218 would undesirably be enabled. The delay through the enabled buffer circuit 216 may be longer than the delay through the inverter 306 and thus there will be no problem with the flip-flop 304 being clocked before the AR signal goes low. Alternatively, one of the flip-flips 302, 304 could be positive edge triggered and the other negative edge triggered and this would eliminate any concern with the flip-flop being disabled (i.e., flip-flop 304 in the present example) being clocked too quickly. The same potential issue applies to clocking the flip-flop 302 when the configuration signal 310 is applied to node 206 to configure the buffer 202 to operate in the opposite direction, and the solutions just discussed with reference to flip-flop 304 apply to flip-flop 302 in this situation.

Figure 4:
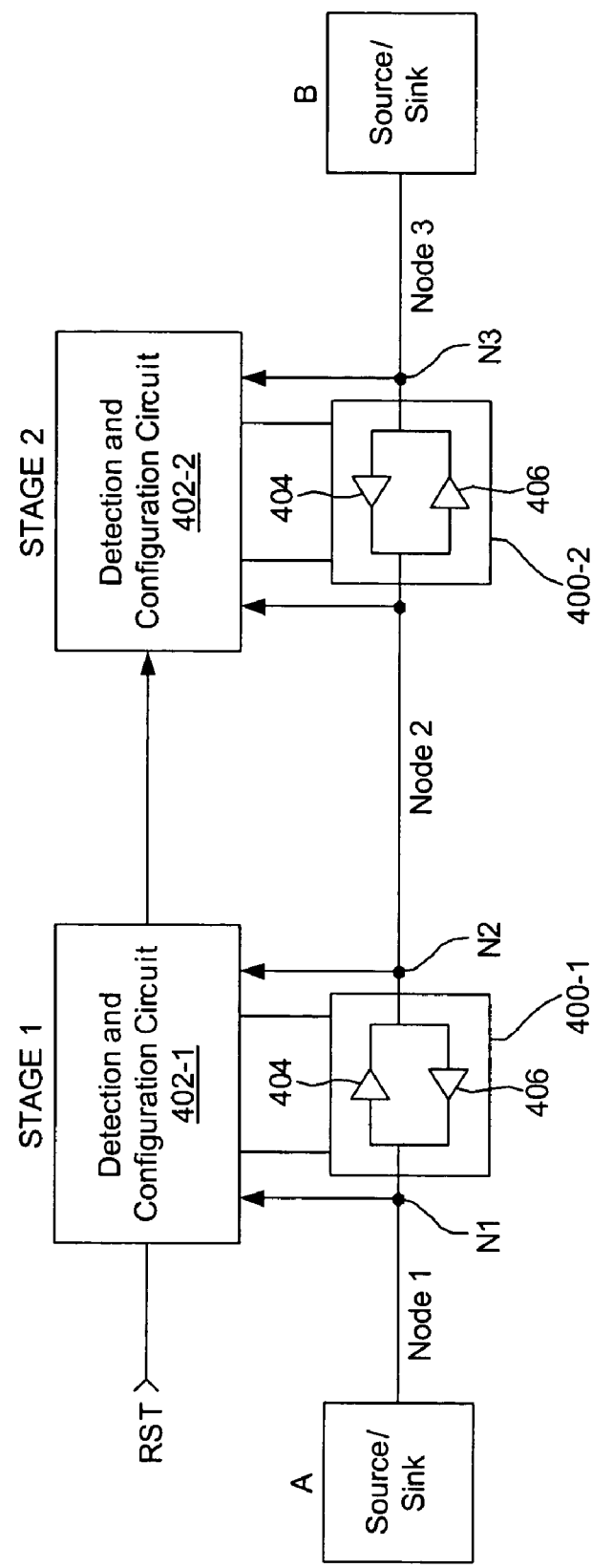
FIG. 4 is a functional block diagram illustrating two series-connected bidirectional buffers each having an associated edge-triggered detection and configuration circuit of FIG. 3.

FIG. 4 is a functional block diagram illustrating two series-connected bidirectional buffers 400-1 and 400-2 having associated edge-triggered detection and configuration circuits 402-1 and 402-2, respectively. The edge-triggered detection and configuration circuits 402-1, 402-2 are each the same as the detection and configuration circuit 300 of FIG. 3 and have been assigned new reference numerals merely for ease of reference. The same is true of bidirectional buffers 400-1, 400-2, with each of the buffers including cross-coupled buffer circuits 404, 406 and each buffer being the same as the bidirectional buffer 202 and buffer circuits 216, 218 of FIG. 2.

Figure 5:
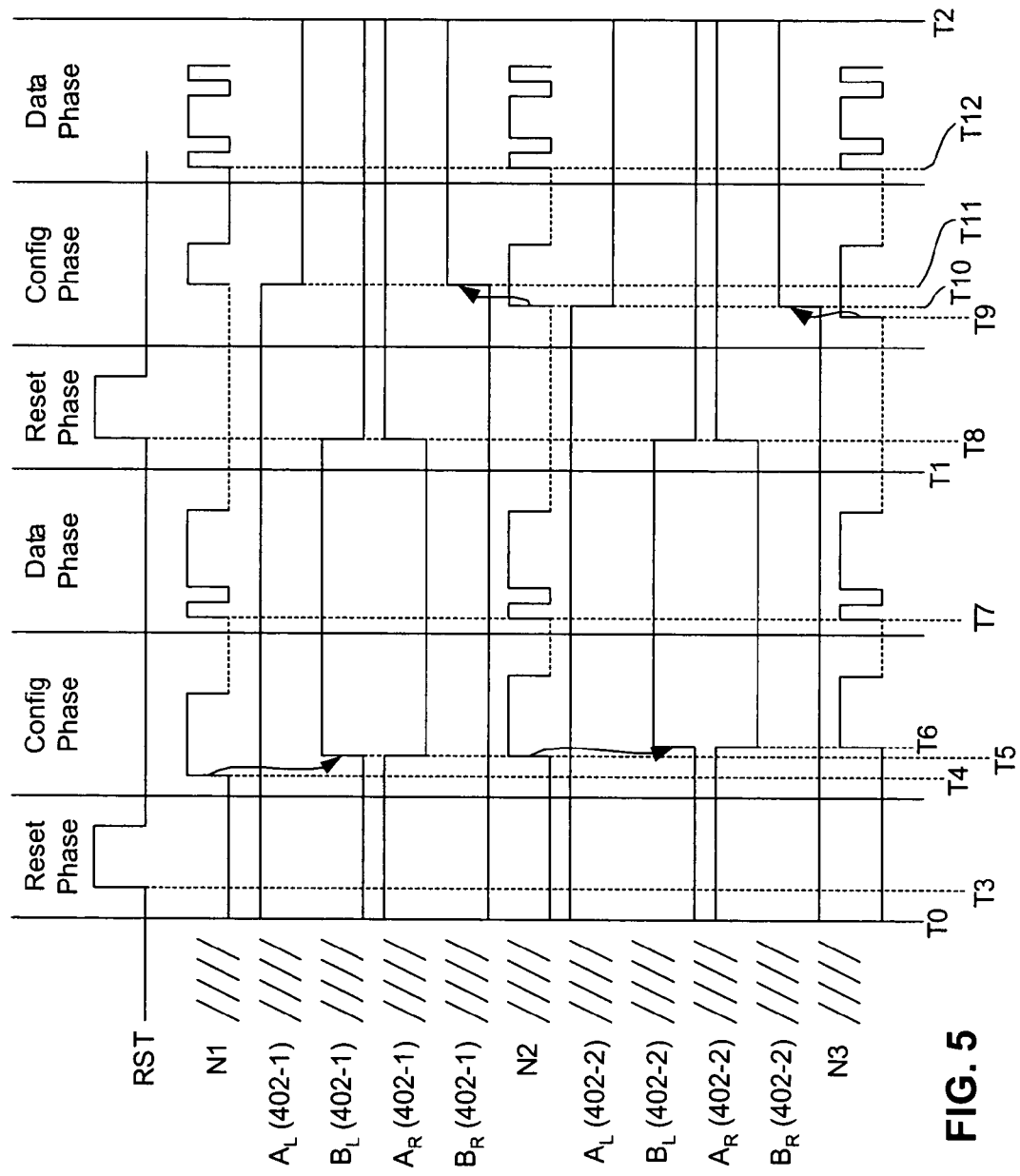
FIG. 5 is a signal timing diagram illustrating signals on various nodes during programming of the series-connected bidirectional buffers of FIG. 4.

The operation of the edge-triggered detection and configuration circuits 402-1 and 402-2 in configuring the series-connected bidirectional buffers 400-1 and 400-2 of FIG. 4 will now be described in more detail with reference to FIGS. 3–5. FIG. 5 is a timing diagram that illustrates various signals in the detection and configuration circuits 402-1, 402-2 during operation. Between a time T0 and a time T1 the timing diagram shows the signals in the detection and configuration circuits 402-1, 402-2 when the bidirectional buffers 400-1, 400-2 are being configured with a node N1 as an input and a node N3 as an output. A node N2 is defined as the node interconnecting the bidirectional buffers 402-1, 402-2. Between the time T1 and a time T2 the timing diagram shows signals in the detection and configuration circuits 402-1, 402-2 when the bidirectional buffers 400-1, 400-2 are being configured with the node N3 as the input node and node N1 as the output node.

The operation of each of the bidirectional buffers 400-1, 400-2 may be viewed as operating in three different modes: 1) reset mode; 2) configuration mode; and 3) data mode. First, the operation of the buffers 400-1, 400-2 will be described between the times T0 and T1 in which the buffers are configured to operate with node N1 as the input node and node N3 as the output node. At a time T3, the RST signal is pulsed active to initiate the reset mode of operation and reset the flip-flops 302, 304 (FIG. 3) in the buffers 400-1, 400-2. Each of the flip-flops 302, 304 latches the associated BL, BR signal inactive low responsive to the active RST signal, and each AL, AR signal goes high responsive to the low BL, BR signals, as previously discussed with reference to FIG. 3.

At a time T4, a rising-edge of a configuration signal is applied on node N1 to initiate the configuration mode of operation. In response to the rising edge of this signal, the flip-flop 302 in detection and configuration circuit 402-1 latches the BL signal high at a time T5 to enable the buffer circuit 404 (circuit 216 in FIG. 3). Also shown occurring at time T5 is the AR signal going low as the high BL signal is applied through the inverter 306 to thereby disable the flip-flop 304 from enabling the associated buffer circuit 406 (circuit 218 in FIG. 3). Note that in FIG. 5 and in the present description the delays of some components in the circuits 402-1, 402-2 and buffers 400-1, 400-2 are ignored for ease of explanation. For example, the AR signal would actually go low slightly after time T5 due the inherent delay of the inverter 306, as will be understood by those skilled in the art. The AL and BR signals remain high and low, respectively, at this point.

The enabled buffer circuit 404 provides a rising edge of the configuration signal on the node N2 at the time T5 responsive to the rising edge of the configuration signal on node N1. In response to this rising edge on the node N2, the flip-flops 302, 304 in the detection and configuration circuit 402-2 operate in the same way as just described for circuit 402-1 to drive the BL signal high and AR signal low at a time T6, with the corresponding AL and BR signals remaining high and low, respectively. The enabled buffer circuit 404 in the buffer 400-2 provides a rising edge of the configuration signal on the node N3 at the time T6 responsive to the rising edge of the configuration signal on node N2, and the configuration of the buffers 400-1, 400-2 is now complete. At this point, the buffers 400-1, 400-2 commence operation in the data mode, and at a time T7 a rising edge of a data signal is applied on node N1 and this edge propagates through the enabled buffer circuits 404 in buffers 400-1, 400-2 to generate corresponding rising edges on nodes N2 and N3 as shown. Once again, note that the delays of the buffer circuits 404 in buffers 400-1, 400-2 are ignored in FIG. 5.

Now the operation of the buffers 400-1, 400-2 will be described between the times T1 and T2 in which the buffers are configured to operate with node N3 as the input node and node N1 as the output node. At a time T8, the RST signal is pulsed active to initiate the reset mode of operation and reset the flip-flops 302, 304 (FIG. 3) in the buffers 400-1, 400-2. Each of the flip-flops 302, 304 latches the associated BL, BR signal inactive low responsive to the active RST signal, and each AL, AR signal goes high responsive to the low BL, BR signals.

At a time T9, a rising-edge of a configuration signal is applied on node N3 to initiate the configuration mode of operation. In response to the rising edge of this signal, the flip-flop 304 in detection and configuration circuit 402-2 latches the BR signal high at a time T10 to enable the buffer circuit 406 (circuit 218 in FIG. 3). Also at time T10 the AL signal goes low as the high BR signal is applied through the inverter 308 (FIG. 3) to thereby disable the flip-flop 302 from enabling the associated buffer circuit 404 (circuit 216 in FIG. 3). The AR and BL signals remain high and low, respectively, at this point.

The enabled buffer circuit 406 provides a rising edge of the configuration signal on the node N2 at the time T10 responsive to the rising edge of the configuration signal on node N3. In response to this rising edge on the node N2, the flip-flops 302, 304 in the detection and configuration circuit 402-1 operate in the same way as just described for circuit 402-2 to drive the BR signal high and AL signal low at a time T11, with the corresponding AR and BL signals remaining high and low, respectively. The enabled buffer circuit 406 in the buffer 400-1 provides a rising edge of the configuration signal on the node N1 at the time T11 responsive to the rising edge of the configuration signal on node N2, and the configuration of the buffers 400-1, 400-2 in this direction is now complete. At this point, the buffers 400-1, 400-2 commence operation in the data mode and at a time T12 a rising edge of a data signal is applied on node N3 and this edge propagates through the enabled buffer circuits 406 in the buffers 400-2 and then 400-1 to generate corresponding rising edges on nodes N2 and N1 as shown. FIGS. 4 and 5 illustrate that the detection and configuration circuits 402-1, 402-2 enable the associated bidirectional buffers 400 to be sequentially configured to operate in the desired direction. Thus, in an integrated circuit including a plurality of buffers 400, the buffers may be sequentially configured in the manner described with reference to FIG. 5.

Figure 6:
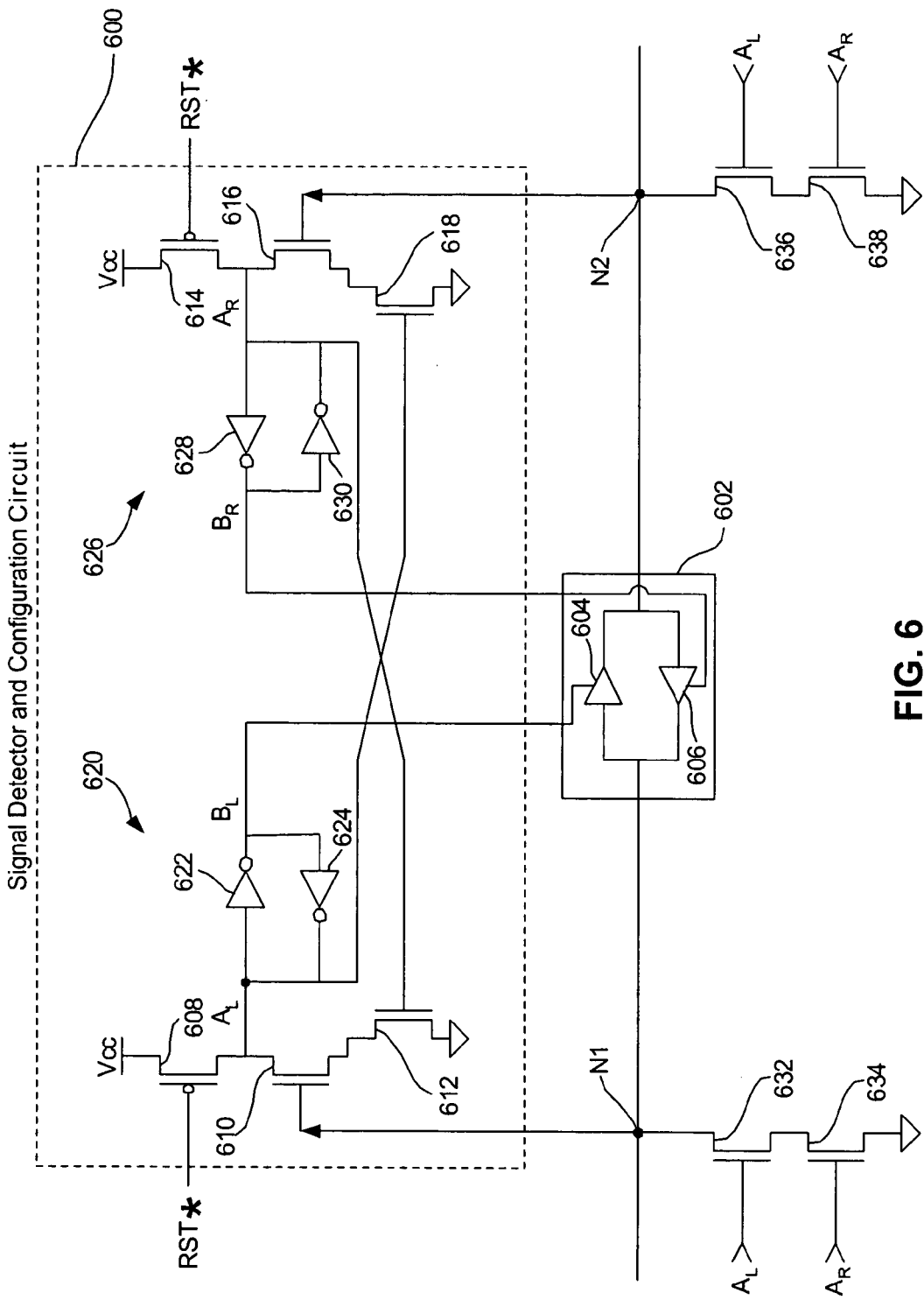
FIG. 6 is a functional block diagram of a level-triggered embodiment of the detection and configuration circuit of FIG. 2.

FIG. 6 is a functional block diagram of a level-triggered detection and configuration circuit 600 corresponding to one embodiment of the detection and configuration circuit 200 of FIG. 2. In this embodiment, the circuit 600 configures the direction of operation of a bidirectional buffer 602 including cross-coupled buffer circuits 604, 606 in response to the voltage levels of signals applied on nodes N1 and N2, as will now be described in more detail below. The detection and configuration circuit 600 includes a PMOS transistor 608 and two NMOS transistors 610, 612 coupled in series between a supply voltage VCC and ground, with the PMOS transistor receiving a reset signal RST* on its gate and the gate of the NMOS transistor 610 being coupled to node N1. The "*" indicates the RST* signal is active low. A PMOS transistor 614 and two NMOS transistors 616, 618 are coupled in series between the supply voltage VCC and ground, with this PMOS transistor also receiving the RST* signal on its gate and the gate of the NMOS transistor 616 being coupled to node N2. The AL signal is also applied to the gate of transistor 618 and the AR signal applied to the gate of transistor 612.

A first latch 620 is formed by a pair of cross-coupled inverters 622, 624 that latch to desired levels a signal AL applied to the gate of transistor 610 and a signal BL applied to the buffer circuit 604. A second latch 626 is formed by a pair of cross-coupled inverters 628, 630 that latch to desired levels a signal AR applied to the gate of transistor 616 and a signal BR applied to buffer circuit 606. A first pair of series-coupled reset transistors 632, 634 are coupled between the node N1 and ground and a second pair of reset transistors 636, 638 are coupled between node N2 and ground, each pair of transistors receiving the AL and AR signals on their respective gates.

In operation, the RST* signal goes active low to initiate a reset mode of operation in which the circuit 600 is reset prior to configuration of the buffer 602. In response to the low RST* signal, the PMOS transistors 608, 614 turn ON, causing the latch 620 to latch the signal AL high and BL low and the latch 626 to latch the signal AR high and BR low. The low BL, BR signals disable the buffer circuits 604, 606, respectively, and the high AL, AR signals enable both pairs of reset transistors 632–638 such that the transistors 632 and 634 drive node N1 low and transistors 636 and 638 drive node N2 low.

The RST* signal then goes inactive high to terminate the reset mode and a configuration signal having an active high voltage is applied on either node N1 or N2 to commence the configuration mode of operation. Note that it is the voltage "level" of the configuration signal that configures the buffer 602 in contrast to the edge-triggered embodiment of FIG. 3 in which transitions of the configuration signal function to configure the buffer. The configuration signal is applied on node N1 to configure the buffer 602 to operate in a first direction with the node N1 as an input node and N2 as an output node, and is applied on node N2 to configure the buffer to operate in a second direction with the node N2 as an input node and N1 as an output node. When the active high configuration signal is applied on node N1, the voltage on this node goes high and transistor 610 turns ON. The reset transistors 632, 634 are very small transistors so that the configuration signal may easily drive node N1 high, as will be appreciated by those skilled in the art. The same is true of reset transistors 636, 638 and node N2. When the transistor 610 turns ON responsive to the high signal on node N1, both transistors 610 and transistor 612, which receives a high AR signal, are activated and thereby drive the signal AL low.

At this point, the latch 620 latches the AL signal low and the BL signal high, with the high BL signal being applied to enable the buffer circuit 604. The transistor 618 is turned OFF responsive to the low AL signal and thus even when the high configuration signal on node N1 propagates through the buffer circuit 604, the state of latch 626 does not change since transistor 616 will turn ON but transistor 618 remains turned OFF. The bidirectional buffer 602 now commences operation in the data mode and the buffer circuit 603 provides a data signal on node N2 responsive to a data signal on node N1. The operation of the detection and configuration circuit 600 to configure the bidirectional buffer 602 to operate in the opposite direction such that the buffer circuit 606 is enabled will by understood by those skilled in the art from the above description, and thus, for the sake of brevity, will not be described in more detail. Similarly, the operation of the circuit 600 in configuring series-connected buffers 602 is analogous to the previous description of FIG. 4 and thus also will be understood by those skilled in the art and not described in more detail.

Figure 7:
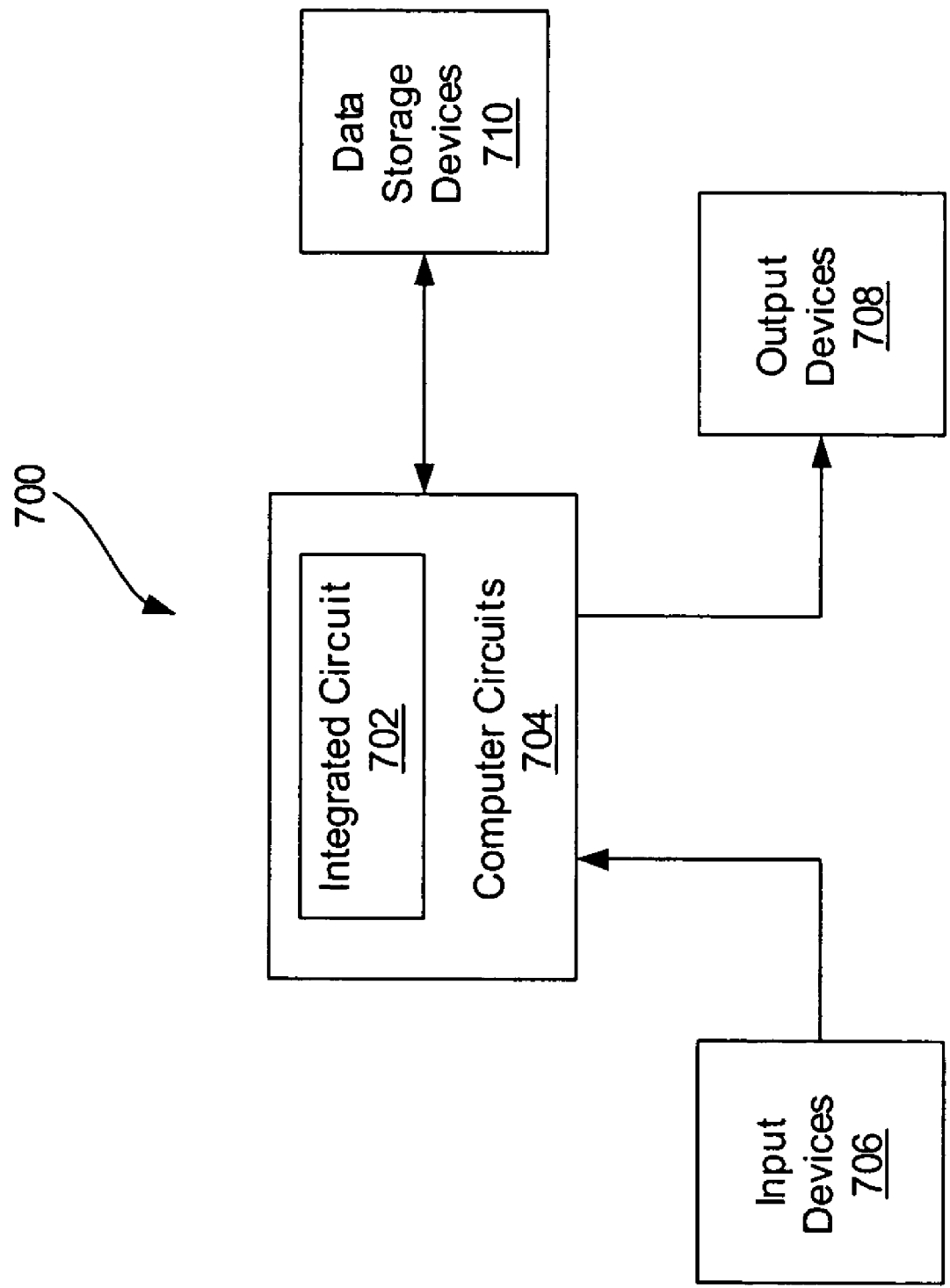
FIG. 7 is a functional block diagram of a computer system including an integrated circuit containing a number of bidirectional buffers and detection and configuration circuits of FIGS. 2, 3, and/or 6.

FIG. 7 is a functional block diagram of a computer system or other electronic system 700 including an integrated circuit 702 containing a number of bidirectional buffers and detection and configuration circuits (not shown) of FIGS. 2, 3, and/or 6. The integrated circuit 702 may be any of a variety of types of integrated circuit, such as an FPGA, memory device, or digital signal processing chip including the present bidirectional buffers and detection and configuration circuits. The computer system 700 includes computer circuitry 704 coupled to the integrated circuit 702 for performing various computing functions, such as executing specific software to perform specific calculations or tasks. In addition, the computer system 700 includes one or more input devices 706, such as a keyboard or a mouse, coupled to the computer circuitry 704 to allow an operator to interface with the computer system. Typically, the computer system 700 also includes one or more output devices 708 coupled to the computer circuitry 704, such as output devices typically including a printer and a video terminal. One or more data storage devices 710 are also typically coupled to the computer circuitry 704 to store data or retrieve data from external storage media (not shown). Examples of typical storage devices 710 include hard and floppy disks, tape cassettes, compact disk read-only (CD-ROMs) and compact disk read-write (CD-RW) memories, and digital video disks (DVDs).

In the above description of embodiments of the present invention, one skilled in the art will understand suitable circuitry for forming various components in these embodiments. For example, the buffer circuits described in the various embodiments could be formed by series connected inverters, each inverter being formed by a series-connected PMOS and NMOS transistor and having another series connected NMOS transistor coupled to receive the corresponding BL or BR signal. Moreover, one skilled in the art will understood that even though various embodiments and advantages of the present invention have been set forth in the foregoing description, the above disclosure is illustrative only, and changes may be made in detail and yet remain within the broad principles of the invention. For example, some of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A method of configuring a bidirectional buffer, the buffer including first and second data signal nodes and the method comprising:
    applying a configuration signal on one of the first and second data signal nodes;
    configuring the buffer responsive to the applied configuration signal; and
    applying a reset signal to disable the buffer prior to applying the configuration signal on one of the first and second data signal nodes.

2. The method of claim 1 wherein configuring the buffer responsive to the applied configuration signal comprises detecting an edge of the applied configuration signal.

3. The method of claim 1 wherein configuring the buffer responsive to the applied configuration signal comprises detecting a level of the applied configuration signal.

4. The method of claim 1 wherein applying the configuration signal on one of the first and second data signal nodes comprises:
    selecting one of the data signal nodes to which the configuration signal is to be applied, wherein the selected data signal node determines a direction of operation of the buffer; and
    applying the configuration signal to the selected data signal node.

5. The method of claim 1 wherein the configuration signal comprises a series of pulses.

6. The method of claim 1 wherein configuring the buffer responsive to the applied configuration signal comprises enabling the buffer to operate in a first direction with the first data signal node corresponding to an input node and the second data signal node corresponding to an output node.

7. A method of configuring a bidirectional buffer, the buffer including first and second signal nodes and the method comprising:
    applying a configuration signal on one of the first and second data signal nodes;
    storing a first memory bit responsive to the applied configuration signal, the first memory bit having a first logic state;
    enabling the buffer to operate in a first direction responsive to the stored memory bit;
    storing a second memory bit having a second logic state responsive to storing the first memory bit.

8. The method of claim 7 wherein the second memory bit has logic state that is the complement of the first logic state.

9. The method of claim 8 wherein storing a second memory bit having a second logic state responsive to storing the first memory bit comprises maintaining the second memory bit at the complement of the first logic state responsive to storing the first memory bit.

10. A bidirectional programmable buffer, comprising:
    a pair of cross-coupled buffer circuits, each buffer circuit including an enable input and the cross-coupled pair of buffer circuits having two data nodes; and
    a detection and configuration circuit coupled to the enable inputs of the buffer circuits and coupled to the two data nodes, the detection and configuration circuit operable in a configuration mode to detect a configuration signal applied on one of the data nodes and to enable a corresponding one of the buffer circuits responsive to the detected configuration signal, and operable in a data mode to provide through the enabled buffer circuit a data signal applied on one of the data nodes responsive to the data signal being applied on the other of the data nodes.

11. The bidirectional programmable buffer of claim 10 wherein the detection and configuration circuit comprises:
    a first edge-triggered storage circuit having a clock input coupled to one of the data nodes, an output coupled to the enable input of one of the buffer circuits, and an input, the first edge-triggered storage circuit operable responsive to an edge of a configuration signal applied on the clock input to provide on the output a signal having a complementary logic state of a signal on the input; and
    a second edge-triggered storage circuit having a clock input coupled to the other one of the data nodes, an output coupled to the enable input of the other one of the buffer circuits and coupled to the input of the first edge-triggered storage circuit, and having an input coupled to the output of the first edge-triggered storage circuit, second edge-triggered storage circuit operable responsive to an edge of a configuration signal applied on the clock input to provide on the output a signal having a complementary logic state of a signal on the input.

12. The bidirectional programmable buffer of claim 11 wherein the first and second edge-triggered storage circuits each comprise:
    a flip-flop; and
    an inverter coupled between the output of each flip-flop and the input of the other flip-flop.

13. The bidirectional programmable buffer of claim 12 wherein each of the flip-flops further includes a reset input adapted to receive a reset signal.

14. The bidirectional programmable buffer of claim 10 wherein the detection and configuration circuit comprises:
    a first level-triggered storage circuit having an output coupled to the enable input of one of the buffer circuits and having an input coupled to one of the two data nodes, the first level-triggered storage circuit operable responsive to a level of a configuration signal applied on the data node to provide an enable signal to the corresponding buffer circuit; and
    a second level-triggered storage circuit having an output coupled to the enable input of the other one of the buffer circuits and having an input coupled to the other one of the two data nodes, the second level-triggered storage circuit operable responsive to a level of a configuration signal applied on the data node to provide an enable signal to the corresponding buffer circuit.

15. The bidirectional programmable buffer of claim 14 wherein each of the level-triggered storage circuits comprises:
    a latch circuit having an input and having an output coupled to the enable input of the corresponding buffer circuit, the latch circuit operable to latch a signal on the output to a first logic state that is the complement of the logic state of a signal applied on the input; and
    first, second, and third controllable switches having signal terminals coupled respectively between a supply voltage source and a reference voltage source, each of the switches having a control terminal and wherein the control terminal of the first switch is adapted to receive a reset signal and the control terminal of the second switch is coupled to the corresponding data node, and the input of the latch circuit being coupled to a node defined by the interconnection of the signal terminals of the first and second switches, and wherein the control terminal of the third switch is adapted to receive the signal on the input of the latch circuit contained in the other level-triggered storage circuit.

16. The bidirectional programmable buffer of claim 15 wherein the latch circuit comprises a pair of cross-coupled inverters.

17. The bidirectional programmable buffer of claim 15 wherein the first controllable switch comprises a PMOS transistor and wherein the second and third controllable switches each comprise an NMOS transistor.

18. The bidirectional programmable buffer of claim 15 further comprising:
   first and second series-connected controllable reset switches coupled between one of the data nodes and a reference voltage source, each of the switches having a respective control terminal adapted to receive the signal on the input of the latch circuit in one of the level-triggered storage circuits; and
   third and fourth series-connected controllable reset switches coupled between the other one of the data nodes and the reference voltage source, each of these switches having a respective control terminal adapted to receive the signal on the input of the latch circuit in one of the level-triggered storage circuits.

19. A semiconductor circuit, comprising:
   a plurality of bidirectional programmable buffers, each buffer including,
      a pair of cross-coupled buffer circuits, each buffer circuit including an enable input and the cross-coupled pair of buffer circuits having two data nodes; and
      a detection and configuration circuit coupled to the enable inputs of the buffer circuits and coupled to the two data nodes, the detection and configuration circuit operable in a configuration mode to detect a configuration signal applied on one of the data nodes and to enable a corresponding one of the buffer circuits responsive to the detected configuration signal, and operable in a data mode to provide through the enabled buffer circuit a data signal applied on one of the data nodes responsive to the data signal being applied on the other of the data nodes; and
   logic circuitry coupled to at least some of the buffers and operable to execute a desired function.

20. The integrated circuit of claim 19 wherein the semiconductor comprises a memory device.

21. An electronic system, comprising:
   processing circuitry coupled to an integrated circuit, the integrated circuit including a plurality of bidirectional bidirectional programmable buffers and each buffer including,
      a pair of cross-coupled buffer circuits, each buffer circuit including an enable input and the cross-coupled pair of buffer circuits having two data nodes; and
      a detection and configuration circuit coupled to the enable inputs of the buffer circuits and coupled to the two data nodes, the detection and configuration circuit operable in a configuration mode to detect a configuration signal applied on one of the data nodes and to enable a corresponding one of the buffer circuits responsive to the detected configuration signal, and operable in a data mode to provide through the enabled buffer circuit a data signal applied on one of the data nodes responsive to the data signal being applied on the other of the data nodes.

22. The electronic system of claim 21 further comprising:
   an input device coupled to the processing circuitry;
   an output device coupled to the processing circuitry; and
   a data storage device coupled to the processing circuitry.

23. The electronic system of claim 21 wherein the system comprises a computer system.

* * * * *